United States Patent
Hargan

(10) Patent No.: US 7,336,547 B2
(45) Date of Patent: Feb. 26, 2008

(54) MEMORY DEVICE HAVING CONDITIONING OUTPUT DATA

(75) Inventor: Ebrahim H Hargan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 334 days.

(21) Appl. No.: 10/789,190

(22) Filed: Feb. 27, 2004

(65) Prior Publication Data

US 2005/0190635 A1 Sep. 1, 2005

(51) Int. Cl.
*G11C 7/00* (2006.01)

(52) U.S. Cl. ...................... 365/193; 365/231

(58) Field of Classification Search ............... 365/193, 365/231

See application file for complete search history.

(56) References Cited

U.S. PATENT DOCUMENTS

| | | | |
|---|---|---|---|
| 4,144,583 A * | 3/1979 | Lawson et al. ............. | 711/112 |
| 6,272,070 B1 | 8/2001 | Keeth et al. | |
| 6,393,062 B1 | 5/2002 | Furman et al. | |
| 6,445,643 B2 | 9/2002 | Keeth | |
| 6,452,938 B1 | 9/2002 | Fawal et al. | |
| 6,466,626 B1 | 10/2002 | Cecchi | |
| 6,542,999 B1 * | 4/2003 | Dreps et al. ............... | 713/400 |
| 6,570,406 B2 | 5/2003 | Tang et al. | |
| 6,704,818 B1 | 3/2004 | Martin et al. | |
| 6,711,597 B1 | 3/2004 | O'Donnell | |
| 6,759,868 B2 | 7/2004 | Helt et al. | |
| 6,794,900 B2 | 9/2004 | Tang et al. | |
| 6,807,114 B2 | 10/2004 | Keeth et al. | |
| 6,807,613 B1 * | 10/2004 | Keeth et al. ............ | 365/189.05 |
| 6,819,599 B2 | 11/2004 | Schaefer | |
| 6,961,269 B2 * | 11/2005 | Royer .................... | 365/189.01 |
| 7,003,686 B2 * | 2/2006 | Chua-Eoan et al. ........ | 365/233 |
| 2003/0095428 A1 * | 5/2003 | Tran ........................... | 365/149 |
| 2003/0212843 A1 | 11/2003 | Molgaard | |
| 2004/0008547 A1 * | 1/2004 | Kwon et al. ................ | 365/193 |
| 2004/0013182 A1 | 1/2004 | Tonietto et al. | |
| 2004/0124891 A1 | 7/2004 | De Laurentiis et al. | |
| 2006/0248415 A1 | 11/2006 | Ebrahim | |
| 2006/0248425 A1 | 11/2006 | Stimson | |

\* cited by examiner

*Primary Examiner*—Thong Q. Le
(74) *Attorney, Agent, or Firm*—Schwegman, Lundberg & Woessner, P.A.

(57) ABSTRACT

A memory device has a memory array for storing memory data, a conditioning data storage unit for storing conditioning data, and data lines for transferring data. During a memory operation, the memory device transfers both of the condition data and the memory data to the same data lines at different time intervals. The condition data is transferred at one time interval. The memory data is transferred at another time interval. Transferring the conditioning data to the data lines improves the accuracy of the transfer of the memory data at the data lines.

56 Claims, 8 Drawing Sheets

MEMORY DEVICE HAVING CONDITIONING OUTPUT DATA

FIELD OF INVENTION

The present invention relates generally to semiconductor devices, more particularly, to transfer of data in memory devices.

BACKGROUND

Semiconductors devices such as memory devices reside in many computer and electronic products. Memory devices store data.

Most memory devices have data terminals for transferring data and strobe terminals for transferring strobe signals. The data is transferred based on timing derived from the strobe signals.

The data usually includes many data bits. A strobe signal typically has specified timing windows or data valid windows for transferring the data bits. Each data bit is transferred within a data valid window. The accuracy of a data bit is unpredictable when the data bit is transferred outside the data valid window.

Some memory devices are designed to transfer data at a higher data rate. In these memory devices, the timing for the data valid window is usually smaller than that of the memory devices with a lower data rate. When the data valid window gets smaller, keeping data bits within the data valid windows become harder. Thus, in some memory devices, the accuracy of the data decreases at a higher data transfer rate. In some cases, the decrease in accuracy of the data may lead to invalid data.

SUMMARY OF THE INVENTION

The present invention provides circuits and methods for improving the accuracy of the transfer of data in a memory device.

One aspect includes a memory device having a plurality of data lines, a memory array for storing memory data, a conditioning data storage unit for storing conditioning data, and a data selection circuit for selecting data between the memory data and the conditioning data. The memory device also includes a data transceiver circuit for outputting to the data lines the data selected by the data selection circuit, and a strobe transceiver circuit for providing timing information of the data outputted at the data lines.

Another aspect includes a method of transferring data in a memory device. The method sets a latency time interval for outputting memory data to data lines. The latency time interval occurs between an issuance of a command signal and the availability of a first bit of the memory data at the data lines. The method outputs a conditioning data to the data lines during the latency time interval. The method also outputs the memory data to the data lines after the latency time interval.

Other aspects of the present invention will be apparent upon reading the present application including the drawings and claims.

DETAILED DESCRIPTION OF THE EMBODIMENTS

Figure 1:
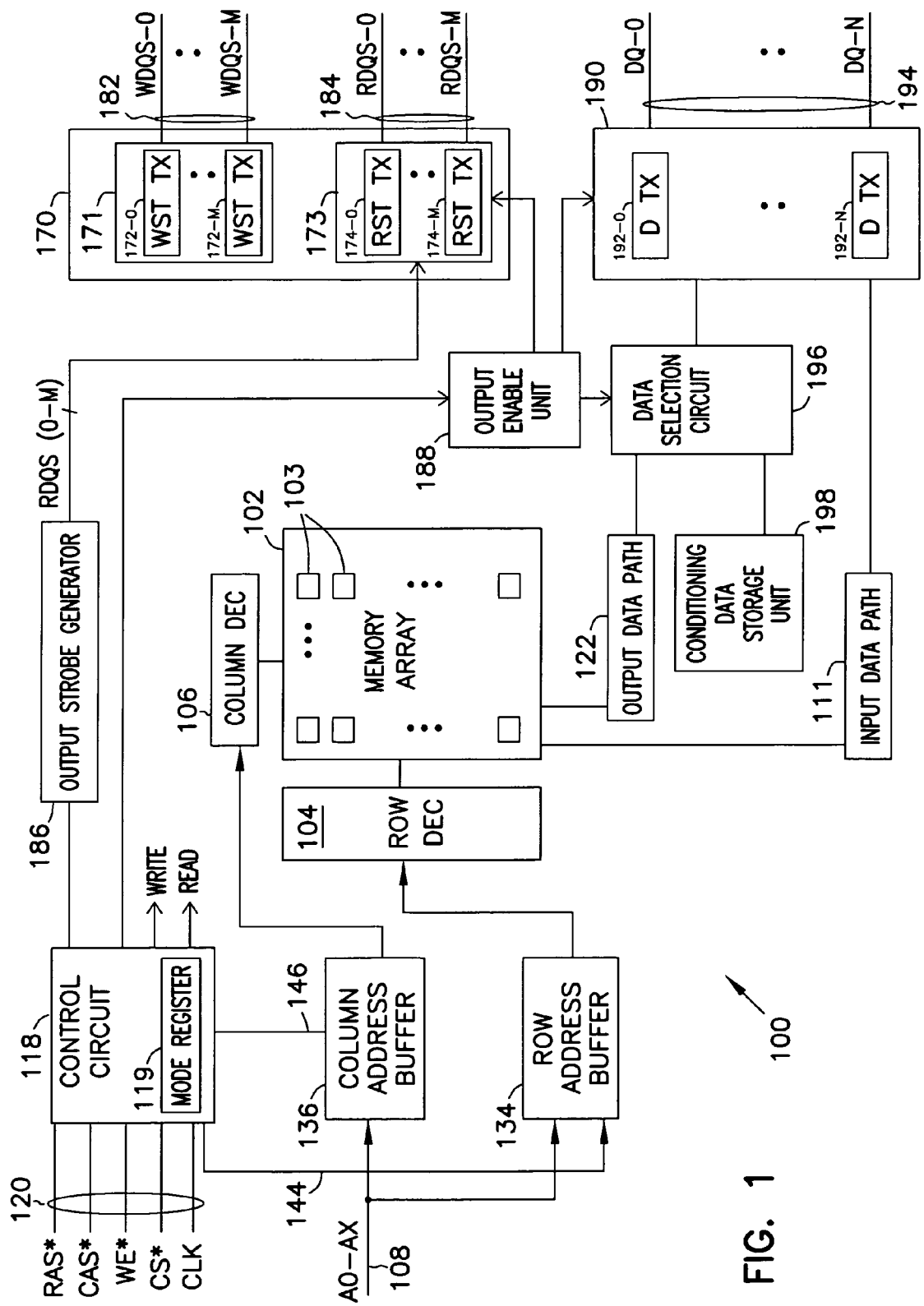
FIG. 1 shows a memory device according to an embodiment of the invention.

The following description and the drawings illustrate specific embodiments of the invention sufficiently to enable those skilled in the art to practice the invention. Other embodiments may incorporate structural, logical, electrical, process, and other changes. In the drawings, like numerals describe substantially similar components throughout the several views. Examples merely typify possible variations. Portions and features of some embodiments may be included in or substituted for those of others. The scope of the invention encompasses the full ambit of the claims and all available equivalents.

FIG. 1 shows a memory device according to an embodiment of the invention. Memory device 100 may be a dynamic random access memory (DRAM) device, a static random access memory (SRAM) device, or a flash memory device. Examples of DRAM devices include synchronous DRAM commonly referred to as SDRAM, SDRAM II, SGRAM (Synchronous Graphics Random Access Memory), DDR SDRAM (Double Data Rate SDRAM), DDR II SDRAM, DDR III SDRAM, GDDR III SDRAM (Graphic Double Data Rate), GDDR IV SDRAM, and Rambus DRAM devices. In FIG. 1, some elements of memory device 100 are omitted for clarity.

Memory device 100 includes a memory array 102 having a plurality of memory cells 103 arranged in rows and columns.

Row decode 104 and column decode 106 access memory cells 103 in response to address signals A0 through AX (A0-AX) provided on address lines 108.

A row address buffer 134 transfers row addresses on lines 108 to row decoder 104 based on a signal on line 144. A column address buffer 136 transfers column addresses on lines 108 to column decoder 106 based on a signal on line 146.

A control circuit 118 controls the operations of memory device 100 based on control signals on control lines 120. Examples of the control signals on lines 120 include a Row Access Strobe signal RAS*, a Column Access Strobe CAS* signal, a Write Enable signal WE*, a Chip Select signal CS*, and a Clock signal CLK. Examples of the operations of memory device 100 include a read operation and a write operation. Control circuit 118 issues a READ command in the read operation and a WRITE command in the write operation.

The write operation writes input data from data lines 194 to memory cells 103. The read operation reads output data from memory cells 103 to data lines 194. Data lines 194 are bi-directional data lines; these lines carry both of the input data provided to memory device 100 by an external source and the output data outputted from memory device 100. A combination of the address signals A0-AX on lines 108 provides the address of a row or a column of memory cells 103 being read or written.

Data lines 194 correspond to external terminals or external connections of memory device 100. In some embodiments, data lines 194 correspond to pins or solder balls on a packaged integrated circuit of memory device 100. In other embodiments, data lines 194 correspond to pads on a circuit die of memory device 100.

Control circuit 118 includes a mode register 119 to store values representing the operating codes of memory device 100. Examples of the operating codes include a write latency time interval and a read latency time interval.

The write latency time interval is a time delay between the issuance of the WRITE command and the availability of a first bit of input data at data lines 194 during the write operation. In some embodiments, the time delay of the write latency time interval is the number of cycles of a clock signal such as the clock signal CLK on lines 120. For example, when mode register 119 stores a value of three (3) for the write latency time interval, the first bit of input data will be available at data lines 194 three cycles of the CLK signal after the WRITE command is issued.

The read latency time interval is a time delay between the issuance of the READ command and the availability of a first bit of output data (from memory array 102) at data lines 194 during the read operation. In some embodiments, the time delay of the read latency time interval is the number of cycles of a clock signal such as the clock signal CLK on lines 120. For example, when mode register 119 stores a value of four (4) for read latency time interval, the first bit of output data will be available at data lines 194 four cycles of the CLK signal after the READ command is issued.

Memory device 100 also includes a strobe transceiver circuit 170, a data transceiver circuit 190, an input data path 111, and an output data path 122. Data transceiver circuit 190 transfers data to and from memory device 100. Strobe transceiver circuit 170 transfers timing information of the data.

Strobe transceiver circuit 170 includes a write strobe unit 171 having write strobe transceivers (WST TX) 172-0 through 172-M, and read strobe unit 173 having read strobe transceivers (RST TX) 174-0 through 174-M. Write strobe unit 171 transfers timing information of the input data. The write strobe signals WDQS-0 through WDQS-M on lines 182 represent the timing information of the input data. An external source provides the WDQS-0 through WDQS-M signals together with the input data to memory device 100. Read strobe unit 173 transfers timing information of the output data. The read strobe signals RDQS-0 through RDQS-M on lines 184 represent the timing information of the data outputted from memory device 100. An output strobe generator 186 generates the RDQS-0 through RDQS-M.

Data transceiver circuit 190 includes data transceivers (D TX) 192-0 through 192-N. Data transceivers 192-0 through 192-N are bi-directional circuits; they transfer data in both directions. Data transceivers 192-0 through 192-N transfer both of the input data and the output data. The data (data signals or data bits) DQ-0 through DQ-N on data lines 194 represent both of the input data and the output data. DQ-0 through DQ-N represent the input data when memory device 100 receives data during the write operation. DQ-0 through DQ-N represent the output data when memory device 100 outputs data during the read operation.

Input data path 111 transfers data between data transceiver circuit 190 and memory array 102 during the write operation. Output data path 122 transfers data between data transceiver circuit 190 and memory array 102 during the read operation.

Memory device 100 further includes an output enable unit 188, a data selection circuit 196, and a conditioning data storage unit 198.

Output enable unit 188 enables read strobe unit 173 to output the RDQS-0 through RDQS-M signals to lines 184 during the read operation. Output enable unit 188 also enables data transceiver circuit 190 to output the DQ-0 through DQ-M signals to data lines 194 during the read operation.

Conditioning data storage unit 198 stores data. In memory device 100, the data stored in conditioning data storage unit 198 is referred to as conditioning data. The data stored in memory array 102 is referred to as memory data.

Data selection circuit 196 selects data between the conditioning data and the memory data during the read operation. The selected data is transferred to data transceiver circuit 190 for outputting to data lines 194.

In the read operation, memory device 100 outputs the conditioning data and the memory data to data lines 194 at different time intervals. Memory device 100 outputs the conditioning data during a conditioning time interval. Memory device 100 outputs the memory data during a main output time interval. The conditioning time interval occurs before the main output time interval. Thus, in the read operation, the conditioning data is outputted to data lines 194 before the memory data is outputted to data lines 194.

In some embodiments, the conditioning data includes a single bit of data with a bit value of zero or one. In other embodiments, the conditioning data includes multiple bits of data. The multiple bits of data may include bit values of both zero and one.

In some embodiments, conditioning data storage unit 198 is configured as a read-only storage unit such that the value of the conditioning data is fixed or unchangeable. For example, conditioning data storage unit 198 may be configured such that after an initial value of the conditioning data is stored in conditioning data storage unit 198, the initial value cannot be changed to a different value.

In other embodiments, conditioning data storage unit 198 is configured such that the value of the conditioning data may be varied. For example, the conditioning data may be varied by programming different values into conditioning data storage unit 198 at different times.

Memory device 100 outputs the conditioning data to data transceivers 192-0 through 192-N and data lines 194 for conditioning or preparing data transceivers 192-0 through 192-N and data lines 194 during the read operation. Conditioning data transceivers 192-0 through 192-N and data lines 194 improves the accuracy of the memory data outputted at data lines 194 during the read operation.

Figure 2:
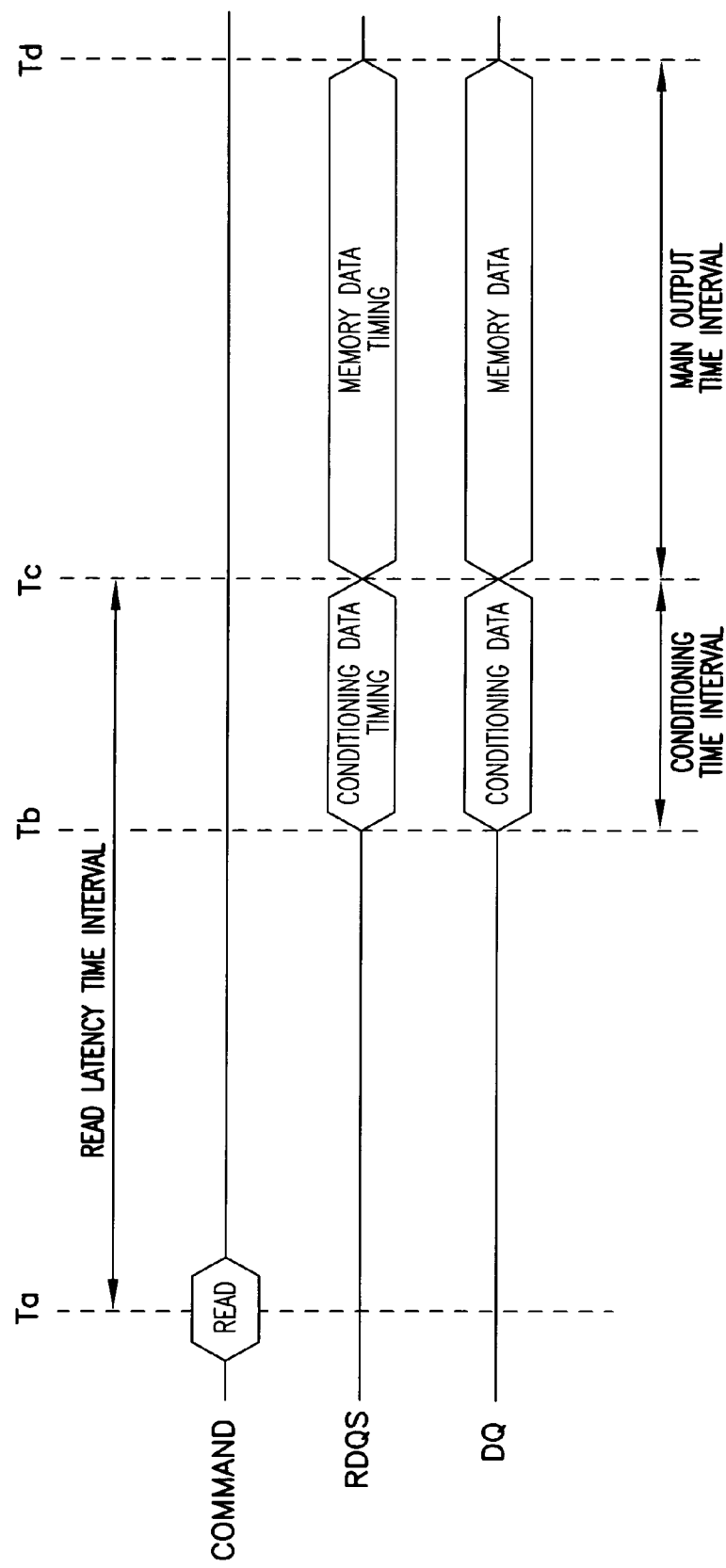
FIG. 2 is an exemplary timing diagram for the memory device of FIG. 1.

FIG. 2 is an exemplary timing diagram for the memory device of FIG. 1. In FIG. 2, Ta, Tb, Tc, and Td represent various times during a read operation. The time interval between Ta and Tc is the read latency time interval. As described previously in FIG. 1, the read latency time interval is a time delay between the issuance of the READ command and the availability of a first bit of memory data at data lines 194. The time interval between Tb and Tc is the conditioning time interval in which conditioning data from conditioning data storage unit 198 is outputted to data lines 194. The conditioning time interval occurs within the latency time interval. The time interval between Tc and Td is the main output time interval in which memory data from memory array 102 is outputted to data lines 194.

COMMAND represents the command issued by control circuit 118 of FIG. 1. FIG. 2 shows the READ command as an example. RDQS represents one of the read strobe signals RDQS-0 through RDQS-M of FIG. 1. DQ represents one of the data signals DQ-0 through DQ-N of FIG. 1. For simplicity, FIG. 2 shows timing information for only one read strobe signal RDQS and data information for only one data signal DQ. The read strobe signals RDQS-0 through RDQS-M and the data signals DQ-0 through DQ-N of FIG. 1 have timing information and data information similar to that of RDQS and DQ shown in FIG. 2.

At time Ta, the READ command is issued. Since the read latency time interval is between Ta and Tc, the first bit of the memory data is not available at data lines 194 until time Tc, which is the end of the read latency time interval. Before time Tc, memory device 100 uses the conditioning time interval for conditioning data transceivers 192-0 through 192-N and data lines 194.

At time Tb, both of the RDQS signal and the conditioning data are simultaneously outputted. The conditioning data is continued to be outputted until time Tc. Between time Tb and Tc, the RDQS signal may be used to carry the timing information for the conditioning data.

At time Tc, which is the end of the read latency time interval, memory data is started to be outputted. The memory data is outputted until time Td. Between time Tc and Td, the RDQS signal carries the timing information for the memory data.

In FIG. 2, since DQ represents both of the conditioning data and the memory data, and since RDQS represents the timing information for both of the conditioning data and the memory data, outputting the conditioning data and the timing information of the conditioning data before outputting the memory data and the timing information of the memory data improve the accuracy of the memory data at data lines 194 (FIG. 1). The accuracy of the memory data at data lines 194 is improved because data transceivers 192-0 through 192-N and data lines 194 are already accustomed to the transfer of data (the conditioning data) transferred to data lines 194 before the memory data is outputted to data lines 194.

FIG. 2 describes the read operation of memory device 100 of FIG. 1 as an example. FIG. 2 may also be used for the write operation of memory device 100. For example, in the write operation, the COMMAND signal is a WRITE command instead of the READ command. The read strobe signal RDQS is replaced by one of the write strobe signals WDQS-0 through WDQS-M. The time interval between Ta and Tc is the write latency time interval. The time interval between Tb and Tc is the conditioning time interval in which conditioning data is transferred to data lines 194 from an external device such as a memory controller or a processor. The time interval between Tc and Td is the time interval in which memory data from the external device is transferred to data lines 194 for writing into memory array 102.

Figure 3:
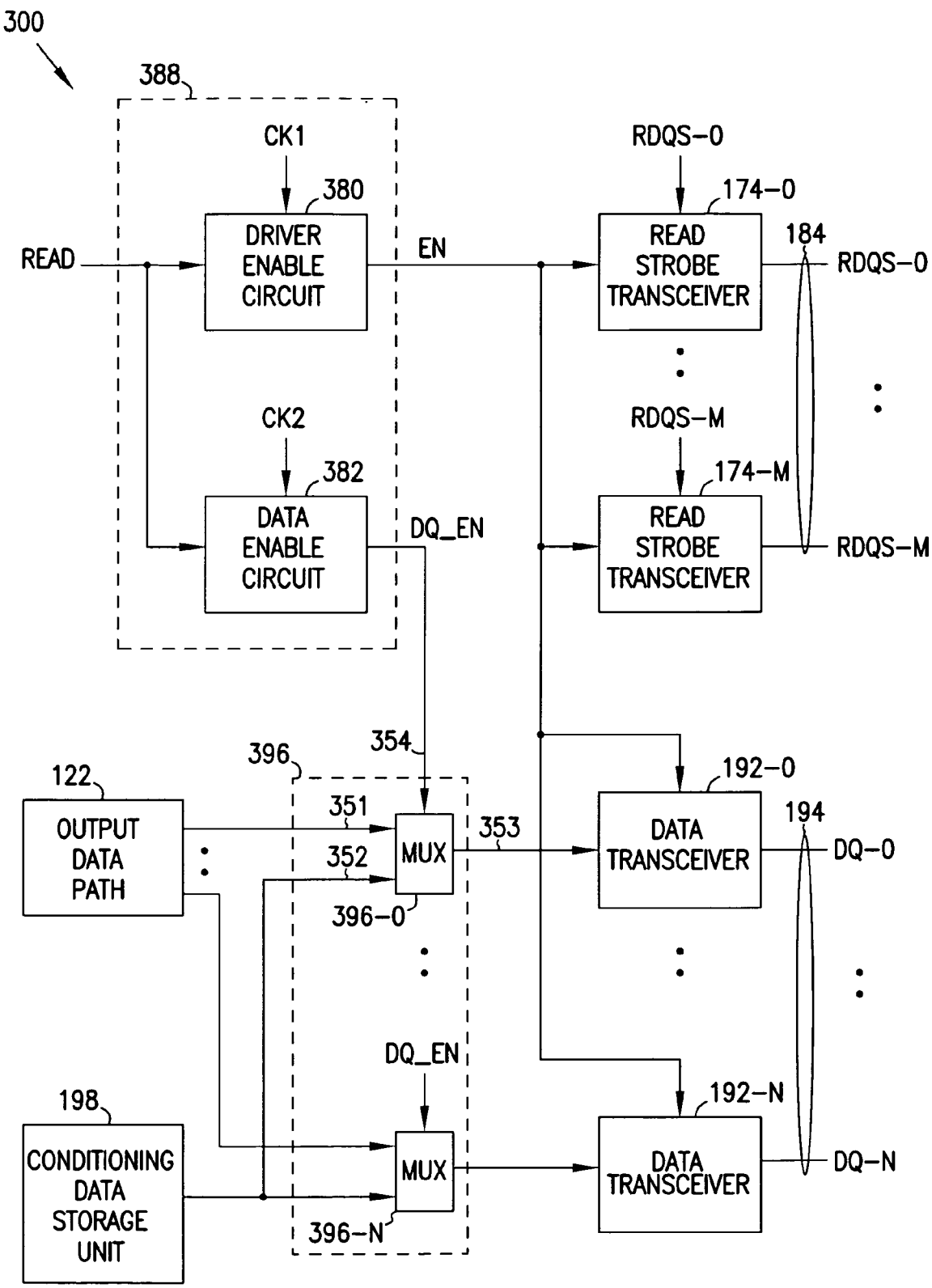
FIG. 3 is a circuit diagram of a portion of a memory device according to an embodiment of the invention.

FIG. 3 is a circuit diagram of a device portion of a memory device according to an embodiment of the invention. Device portion 300 may be included in memory device 100 of FIG. 1. In FIG. 3, a driver enable circuit 380 and a data enable circuit 382 form and output enable unit 388 corresponding output enable unit 188 of FIG. 1. A number of multiplexers (MUX) 396-0 through 396-N forms a data selection circuit 396 corresponding to data selection circuit 196 of FIG. 1.

In FIG. 3, the CK1 and CK2 signals are related to a clock signal such as the CLK signal on line 120 of FIG. 1. In some embodiments, the CK1 and CLK2 signals are generated from the CLK signal. The READ signal in FIG. 3 is generated during a read operation by a control circuit such as control circuit 118 of FIG. 1. Driver enable circuit 380 generates a driver enable signal EN based on the CK1 signal and the READ signal. Data enable circuit 382 generates a data enable signal DQ_EN based on the CK2 signal and the READ signal.

Each of the MUX 396-0 through MUX 396-N includes a first input node 351 connected to output data path 122, a second input node 352 connected to conditioning data storage unit 198, a multiplexing output node 353 connected to one of the data transceivers 192-0 through 192-N, and an enable node 354 to receive the DQ_EN signal.

MUX 396-0 through MUX 396-N use the DQ_EN signal to select data between memory data from output data path 122 and conditioning data from conditioning data storage unit 198. The memory data from output data path 122 is the memory data outputted to output data path 122 from memory array 102. In some embodiments, MUX 396-0 through MUX 396-N select the conditioning data based on a first state of the DQ_EN signal and select the memory data based on a second state of the DQ_EN signal. For example, MUX 396-0 through MUX 396-N select the conditioning data when the DQ_EN signal has high signal level and select the memory data when the DQ_EN signal has a low signal level.

Read strobe transceiver 174-0 through 174-M use the driver enable signal EN to transfer the RDQS-0 through RDQS-M signals to lines 184. In some embodiments, read strobe transceiver 174-0 through 174-M transfer the RDQS-0 through RDQS-M signals to lines 184 based on the states of the driver enable signal EN. For example, read strobe transceiver 174-0 through 174-M transfer the RDQS-0 through RDQS-M signals to lines 184 when the driver enable signal EN has a high signal level.

Data transceivers 192-0 through 192-N use the driver enable signal EN to transfer either the conditioning data or the memory data selected by MUX 396-0 through MUX 396-N to data lines 194. In some embodiments, data transceivers 192-0 through 192-N transfer the conditioning data or the memory data to lines based on the states of the driver enable signal EN. For example, data transceivers 192-0 through 192-N transfer the conditioning data or the memory data to data lines 194 when the driver enable signal EN has a high signal level.

Figure 4:
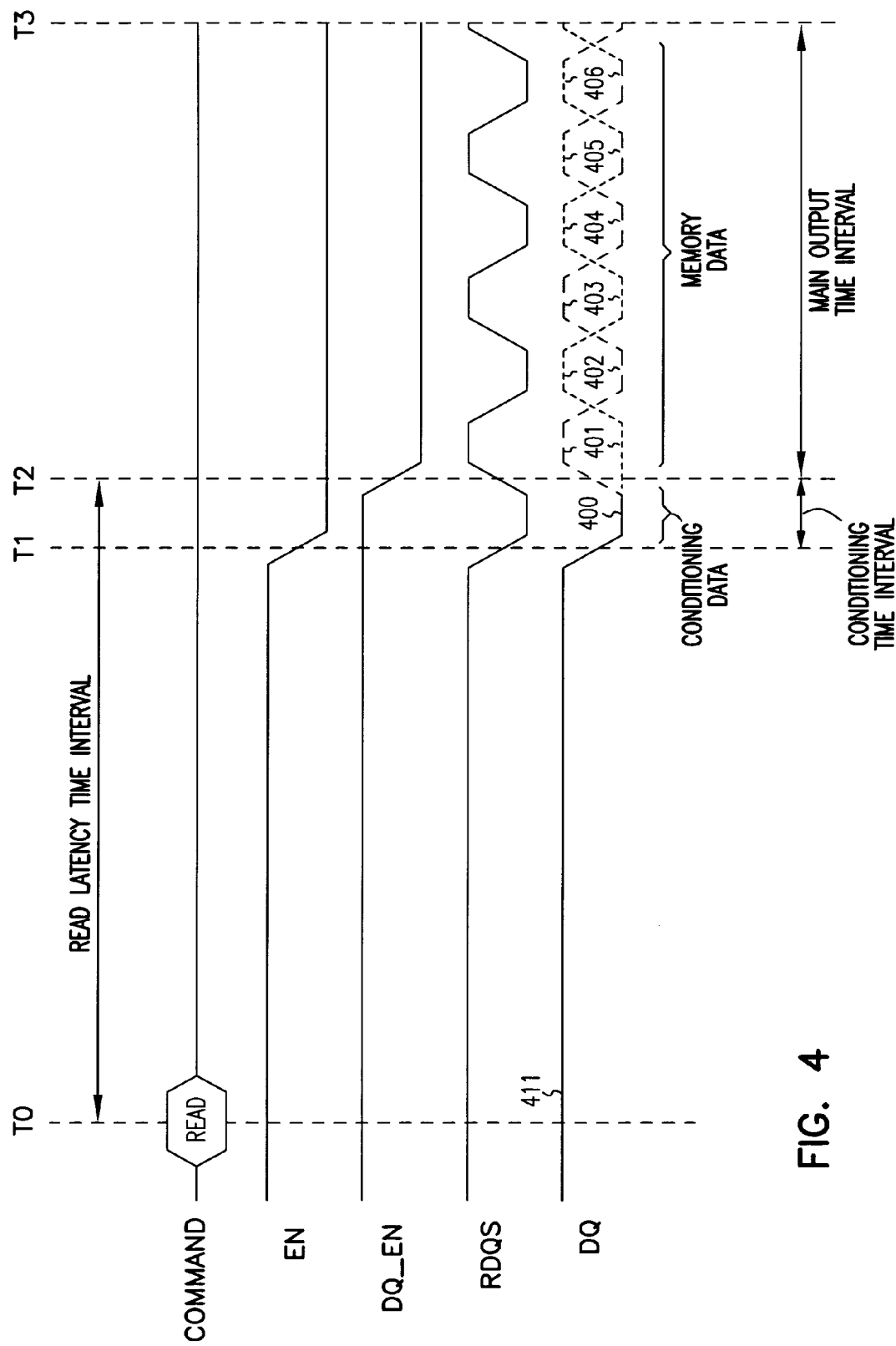
FIG. 4 is an exemplary timing diagram for the portion of the memory device of FIG. 3 showing an output timing of a single bit of conditioning data.

FIG. 4 is an exemplary timing diagram for the portion of the memory device of FIG. 3 showing an output timing of a single bit of conditioning data. In FIG. 4, T0, T1, T2, and T3 represent various times during a read operation. The time interval between T0 and T2 is the read latency time interval, which is a time delay between the issuance of the READ command and the availability of a first bit of memory data at data lines 194. The time interval between T1 and T2 is the conditioning time interval in which conditioning data from conditioning data storage unit 198 is outputted to data lines 194. The conditioning time interval occurs within the latency time interval. The time interval between T2 and T3 is the main output time interval in which memory data from output data path 122 is outputted to data lines 194.

RDQS represents one of the read strobe signals RDQS-0 through RDQS-M of FIG. 3. DQ represents one of the data signals DQ-0 through DQ-N of FIG. 3. For simplicity, FIG. 4 shows timing information for only one read strobe signal RDQS and data information for only one data signal DQ. The read strobe signals RDQS-0 through RDQS-M and the data signals DQ-0 through DQ-N of FIG. 3 have timing information and data information similar to that of the RDQS and DQ signals shown in FIG. 4.

In FIG. 3, data lines 194 are terminated at a signal level such that the DQ-0 through DQ-N signals have an initial signal level. In some embodiments, data lines 194 are terminated at a low signal level such that the DQ-0 through DQ-N signals have a low initial signal level corresponding to a bit value of zero. In other embodiments, data lines 194 are terminated at a high signal level such that DQ-0 through DQ-N have a high initial signal level corresponding to a bit value of one. The initial signal level of data lines 194 is the signal level exists before the conditioning data are transferred to data lines 194. For example, in FIG. 4, the DQ signal has an initial signal level 411, which is a high signal level corresponding to a bit value of one. The high initial signal level 411 indicates that data lines 194 are terminated at the high signal level.

In the example of FIG. 4, the conditioning data includes a single bit of data, which is represented by signal level 400 of the DQ signal. The single bit of the conditioning data has a bit value of zero or low signal level. The memory data includes multiple bits of data, which are represented by signal levels 401 through 406 of the DQ signal. Signal level 401 represents the first bit among the multiple bits of the memory data. FIG. 4 shows signal level 401 includes both low and high signal levels to indicate that the first bit of the memory data may have a bit value of either zero or one.

At time T0, the READ command is issued. Since the read latency time interval is between T0 and T2, the first bit 401 of the memory data is not available at data lines 194 until time T2, which is the end of the read latency time interval. Before time T2, memory device 100 uses the conditioning time interval for conditioning data transceivers 192-0 through 192-N and data lines 194.

At time T1, the driver enable signal EN is activated or switching from high to low. In FIG. 3, since both read strobe transceivers 174-0 through 174-M and data transceivers 192-0 through 192-N use the same EN signal, both read strobe transceivers 174-0 through 174-M and data transceivers 192-0 through 192-N are activated (on) simultaneously when the EN signal is activated. Thus, the timing information represented by the RDQS-0 through RDQS-M signals and data represented by the DQ-0 through DQ-N signals are simultaneously transferred to lines 184 and lines 194, respectively. As shown in FIG. 4, at time T1, the RQDS and DQ signals are simultaneously transferred such that the RDQS and DQ signals simultaneously switch from high to low at time T1.

The data enable signal DQ_EN has high signal level at time T1. In FIG. 3, when the data enable signal DQ_EN has high signal level, MUX 396-0 through 396-N select the conditioning data from conditioning data storage unit 198 and pass the conditioning data to data transceivers 192-0 through 192-N for outputting to data lines 194. In the example of FIG. 4, the conditioning data includes a single bit of data represented by signal level 400 of the DQ signal. The single bit of the conditioning data is outputted during the conditioning time between T1 and T2. Between T1 and T2, the RDQS signal carries the timing information for the single bit of the conditioning data represented by signal level 400 of the DQ signal.

At time T2, which is the end of the read latency time interval, the data enable signal DQ_EN switches from the high signal level to a low signal level. In FIG. 3, when the data enable signal DQ_EN has a low signal level, MUX 396-0 through 396-N select the memory data from output data path 122 pass the memory data to data transceivers 192-0 through 192-N for outputting to data lines 194. In FIG. 4, at time T2, the first bit of the memory data represented by signal level 401 of the DQ signal is outputted. Other bits of the memory data represented by signal levels 402 through 406 are subsequently outputted after time T2. Between T2 and T3, the RDQS signal carries the timing information for the multiple bits of the memory data represented by signal levels 402 through 406.

The RDQS signal has a signal transition when it switches between the low and the high signal levels. Hence, at time T1, the RDQS signal has a first signal transition after the READ command is issued; at time T2, the RDQS signal has a second signal transition after the READ command is issued. Therefore, in the example of FIG. 4, the conditioning data is outputted when the RDQS signal has a first signal transition after the READ command is issued. The memory data is outputted when the RDQS signal has a second signal transition after the READ command is issued.

Signal level 411 of the DQ signal at time T0 represents the initial value of data lines 194. In the example of FIG. 4, the conditioning bit (at 400) has a bit value of zero or low. In response to the first signal transition of the RDQS signal at time T1, the DQ signal makes a transition or switches from high to low when the conditioning bit is outputted. Thus, both of the RDQS and DQ signals have one signal transition or switch once at time T1 before memory data is outputted. At time T2, the memory data is outputted in response to the second transition of the RDQS signal. Depending on the bit value of the first bit (at 401) of the memory data, the DQ signal may switch from low to high at T2. Regardless of the value of the first bit of the memory data at 401, the accuracy of the memory data outputted at T2 is enhanced because both of the RDQS and DQ signals have already accustomed to the switching between the low and high signal levels before time T2. The memory data is further enhanced if the first bit of the memory data have a bit value different from the initial value of the DQ signal at 411. For example, if the first bit (401) of the memory data has a bit value of zero or low, the first bit 401 is more accurately outputted at time T2 because the signal level of the DQ signal is already changed to low before time T2.

In addition, outputting the conditioning data before the memory data maintains the accuracy of the transfer of the first bit of the memory data at data lines 194 when memory device 100 (FIG. 1) increases the data transfer rate at data lines 194. In some embodiments, memory device 100 transfers data at each of the data lines 194 at a data transfer rate of at least one gigabits per second (speed of at least 500 megahertz). In FIG. 4, the time interval between T1 and T2 decreases when the data transfer rate at data lines 194 of memory device 100 increases. The decrease in the time interval between T1 and T2 (as a result of the increase in the data transfer rate) may reduce the accuracy of the memory data, especially the first bit of the memory data. However, outputting the conditioning data to data lines 194 between T1 and T2, before the memory data is outputted to data lines 194, provides conditioning to data transceivers 192-0 through 192-N and data lines 194 so that the accuracy of the first bit of the memory data is maintained when the first bit it is outputted to data lines 194.

Figure 5:
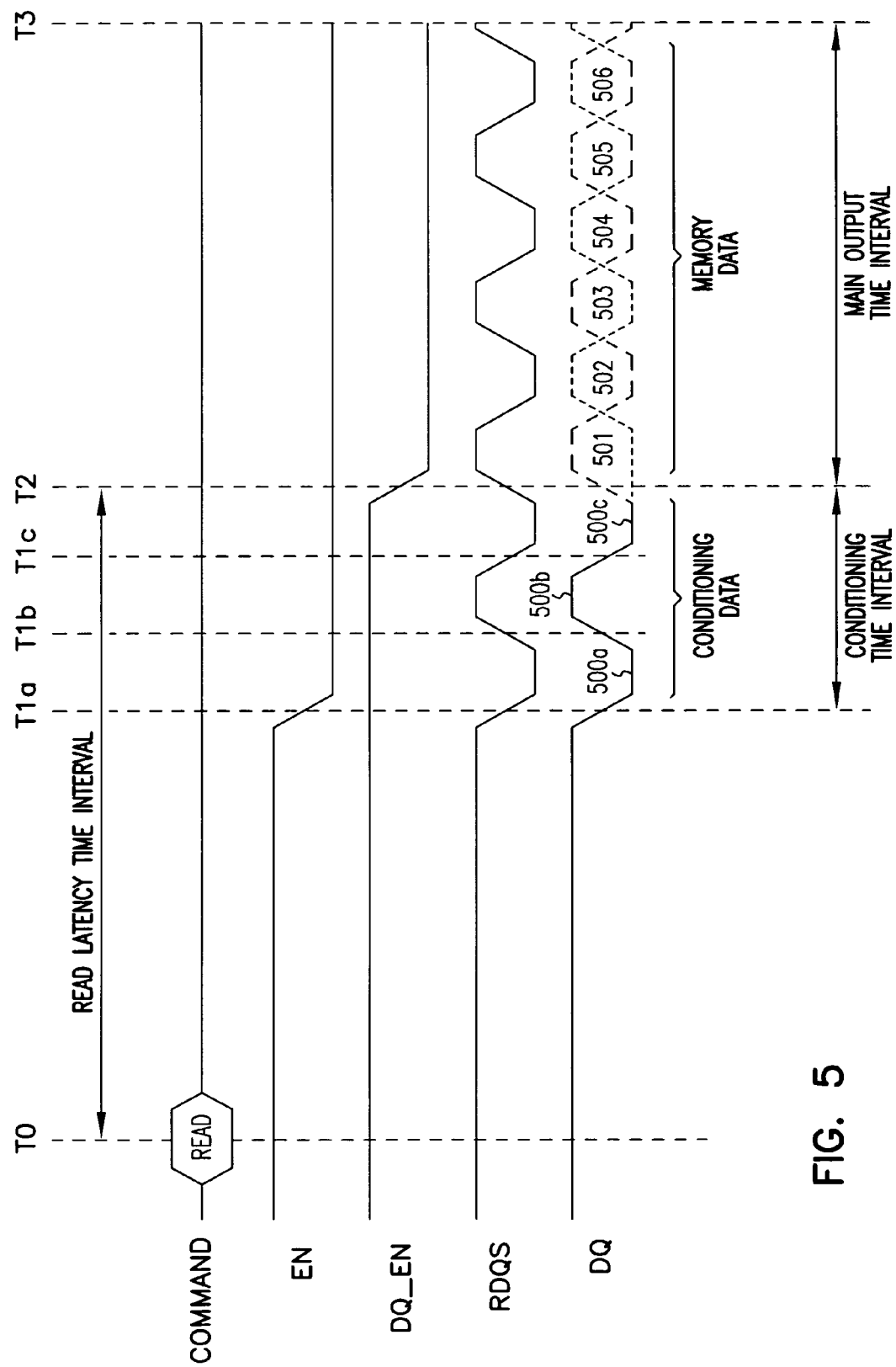
FIG. 5 is an exemplary timing diagram for the portion of the memory device of FIG. 3 showing an output timing of multiple bits of conditioning data.

FIG. 5 is an exemplary timing diagram for the portion of the memory device of FIG. 3 showing an output timing of multiple bits of conditioning data.

In FIG. 5, T0, T1a, T1b, T1c, T2, and T3 represent various times during a read operation. The time interval between T0 and T2 is the read latency time interval. The time interval between T1a and T2 is the conditioning time interval in which conditioning data from conditioning data storage unit 198 is outputted to data lines 194. The time interval between T2 and T3 is the main output time interval in which memory data from output data path 122 is outputted to data lines 194.

RDQS represents one of the read strobe signals RDQS-0 through RDQS-M of FIG. 3. DQ represents one of the data signals DQ-0 through DQ-N of FIG. 3. For simplicity, FIG. 5 shows timing information for only one read strobe signal RDQS and data information for only one data signal DQ. The read strobe signals RDQS-0 through RDQS-M and the data signals DQ-0 through DQ-N of FIG. 3 have timing information and data information similar to that of the RDQS and DQ signals shown in FIG. 5.

In the example of FIG. 5, the conditioning data includes multiple bits of data, which are represented by signal levels 500a, 500b, and 500c of the DQ signal. The multiple bits of the conditioning data have bit values of zero, one, and zero as indicated by the signal levels 500a, 500b, and 500c having signal levels of low, high, and a low. The memory data includes multiple bits of data, which are represented by signal levels 501 through 506 of the DQ signal. Signal level 501 represents the first bit among the multiple bits of the memory data. FIG. 5 shows that signal level 501 includes both low and high signal levels to indicate that the first bit of the memory data may have a bit value of either zero or one.

At time T0, the READ command is issued. Since the read latency time interval is between T0 and T2, the first bit 501 of the memory data is not available at data lines 194 until time T2, which is the end of the read latency time interval. Before time T2, memory device 100 uses the conditioning time interval for conditioning data transceivers 192-0 through 192-N and data lines 194.

At time T1a, the driver enable signal EN is activated or switching from high to low. In FIG. 3, since both read strobe transceivers 174-0 through 174-M and data transceivers 192-0 through 192-N use the same EN signal, both read strobe transceivers 174-0 through 174-M and data transceivers 192-0 through 192-N are activated (on) simultaneously. Thus, the timing information represented by the RDQS-0 through RDQS-M signals and data represented by the DQ-0 through DQ-N signals are simultaneously transferred to lines 184 and lines 194, respectively. As shown in FIG. 5, at time T1a, the RQDS and DQ signals are simultaneously transferred such that the RDQS and DQ signals simultaneously switch from high to low at time T1a.

The data enable signal DQ_EN has high signal level at time T1a. In FIG. 3, when the data enable signal DQ_EN has high signal level, MUX 396-0 through 396-N select the conditioning data from conditioning data storage unit 198 and pass the conditioning data to data transceivers 192-0 through 192-N for outputting to data lines 194. The DQ_EN signal remains high until time T2. Thus, between T1a and T2, MUX 396-0 through 396-N select only the conditioning data from conditioning data storage unit 198. In the example of FIG. 5, the conditioning data, represented by signal levels 500a, 500b, and 500c of the DQ signal, are outputted during the conditioning time between T1a and T2. The RDQS signal has multiple signal transitions between T1a and T2 to carry the timing information for the multiple bits of the conditioning data. In FIG. 5, each of the multiple bits of the conditioning data is outputted at one of the signal transitions of the RDQS signal. In some embodiments, the RDQS and the DQ signals have unequal number of signal transitions between T1a and T2 such that the multiple bits of the conditioning data are outputted to data lines 194 independently from the signal transitions of the RDQS signal.

At time T2, which is the end of the read latency time interval, the data enable signal DQ_EN switches from the high signal level to a low signal level. In FIG. 3, when the data enable signal DQ_EN has a low signal level, MUX 396-0 through 396-N select the memory data from output data path 122 and pass the memory data to data transceivers 192-0 through 192-N for outputting to data lines 194. In FIG. 5, at time T2, the first bit of the memory data represented by signal level 501 of the DQ signal is outputted. Other bits of the memory data represented by signal levels 502 through 506 are subsequently outputted after time T2. Between T2 and T3, the RDQS signal carries the timing information for the memory data.

In the example of FIG. 5, the conditioning data includes an odd number (three) of bits with different bit values as represented by different signal levels 500a, 500b, and 500c. The bit values of the bits of the conditioning data form a pattern of alternating bit values such that any two consecutive bits of the conditioning data have different bit values. For example, in FIG. 5, the bits of the conditioning data form a pattern of low, high, and low (010) as shown by the low, high, and low of signal levels 500a, 500b, and 500c.

For a situation such as a transfer of data at a higher data rate, the pattern of alternating bit values of the conditioning data allows the DQ signal at data lines 194 of FIG. 3 to have initial signal swings between the low and high signals before the memory data is outputted to data lines 194. Thus, when the memory data is outputted at data lines 194, the accuracy of the memory data is improved because the signal swings of the memory data have already been conditioned by the pattern of alternating bit values of the conditioning data.

FIG. 5 shows the condition data having an odd number of bits as an example. In some embodiments, the condition data may have an even number of bits, e.g., two or four. The even number of bits of the conditioning data may have bit values arranged in a pattern of alternating bit values such as that of the bit values of the conditioning data of FIG. 5.

Figure 6:
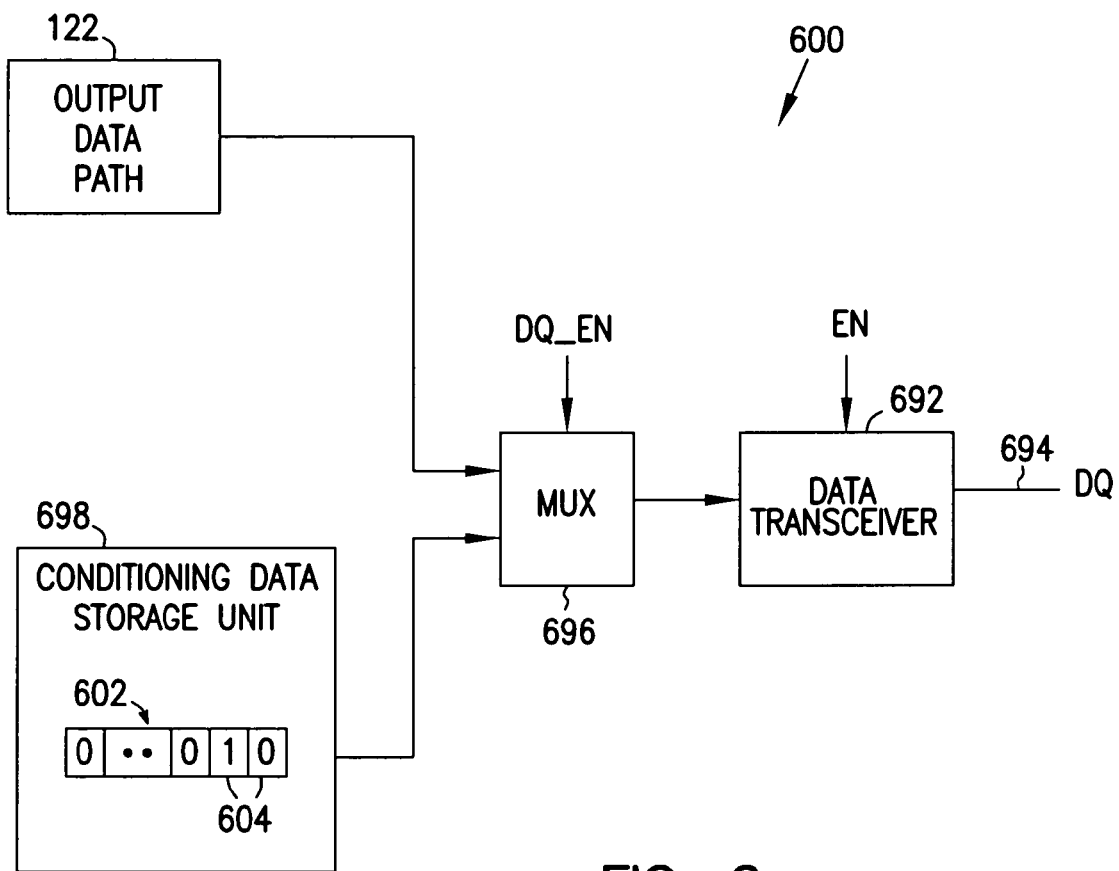
FIG. 6 is a diagram of a portion of a memory device including an embodiment of a conditioning data storage unit according to an embodiment of the invention.

FIG. 6 is a diagram of a portion of a memory device including an embodiment of conditioning data storage unit according to an embodiment of the invention. Device portion 600 may be included in device portion 300 of FIG. 3. In FIG. 6, conditioning data storage unit 698, MUX 696, and data transceiver 692 corresponds to conditioning data storage unit 198, one of the MUX 396-0 through MUX 396-N, and one of the data transceiver 192-0 through 192-N of FIG. 3. Data line 694 corresponding to one of the data lines 194 of FIG. 3.

In FIG. 6, conditioning data storage unit 698 includes a register 602 having a number of register cells 604. Each of the register cells 604 stores one bit of data with a known bit value such as bit value of zero or bit value of one. The bits in register cells 604 represent the conditioning data. In some embodiments, register 602 includes only one register cell for storing a single bit of data representing the conditioning data. During a conditioning time interval, as described in FIG. 1 through FIG. 5, MUX 696 selects at least one of the bits in register 604 and passes the bits to data transceiver 692 for outputting to data line 694.

Figure 7:
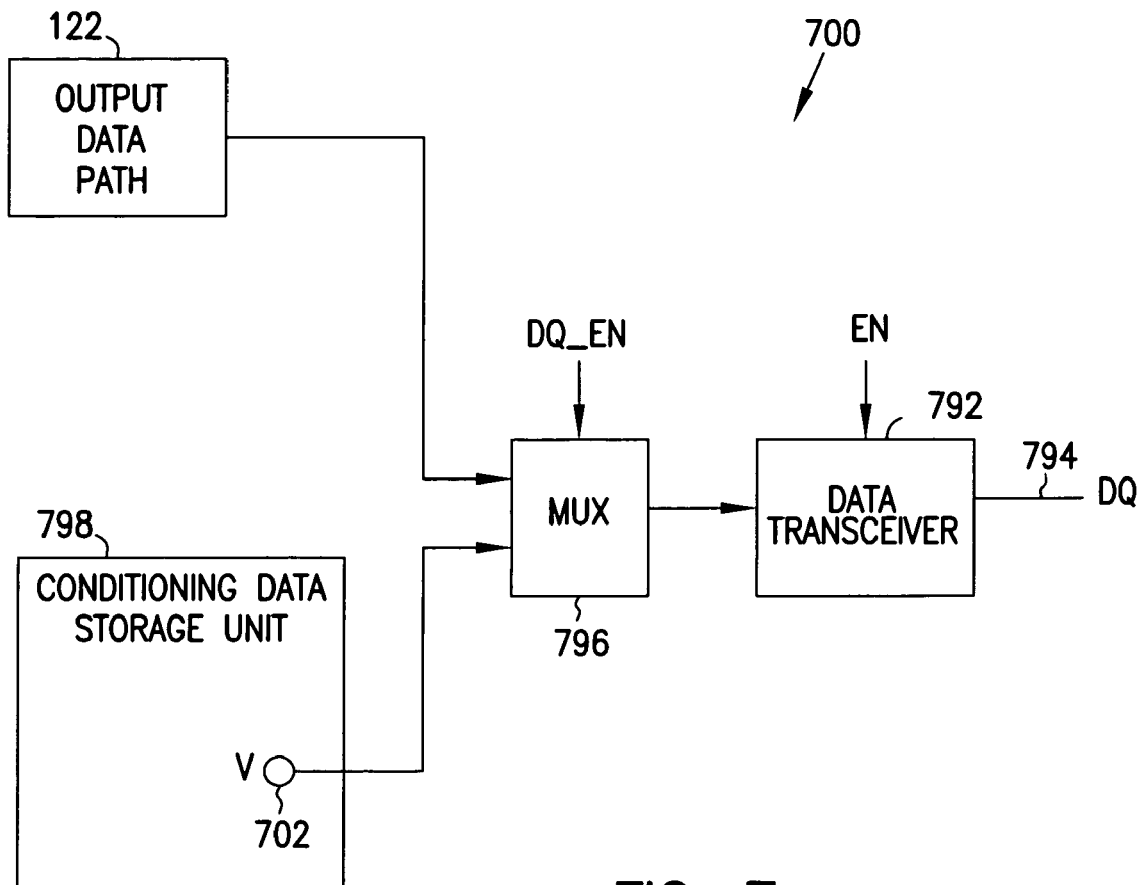
FIG. 7 is a diagram of a portion of a memory device including another embodiment of a conditioning data storage unit according to an embodiment of the invention.

FIG. 7 is a diagram of a portion of a memory device including another embodiment of a conditioning data storage unit according to an embodiment of the invention. Device portion 700 may be included in device portion 300 of FIG. 3. In FIG. 7, conditioning data storage unit 798, MUX 796, and data transceiver 792 corresponds to conditioning data storage unit 198, one of the MUX 396-0 through MUX 396-N, and one of the data transceiver 192-0 through 192-N of FIG. 3. Data line 794 corresponding to one of the data lines 194 of FIG. 3. In FIG. 7, conditioning data storage unit 798 includes a storage node 702. Node 702 receives a voltage source V in which the voltage value of V represents a bit value of either one or zero. In some embodiments, storage node 702 connects to a voltage supply of a memory device such as memory device 100 of FIG. 1. In other embodiments, storage node 702 connects to ground. The voltage value of storage node 702 represents the conditioning data. During a conditioning time interval, as described in FIG. 1 through FIG. 5, MUX 796 selects the conditioning data represented by the voltage value of storage node 702 passes the conditioning data to data transceiver for outputting to data line 794.

Figure 8:
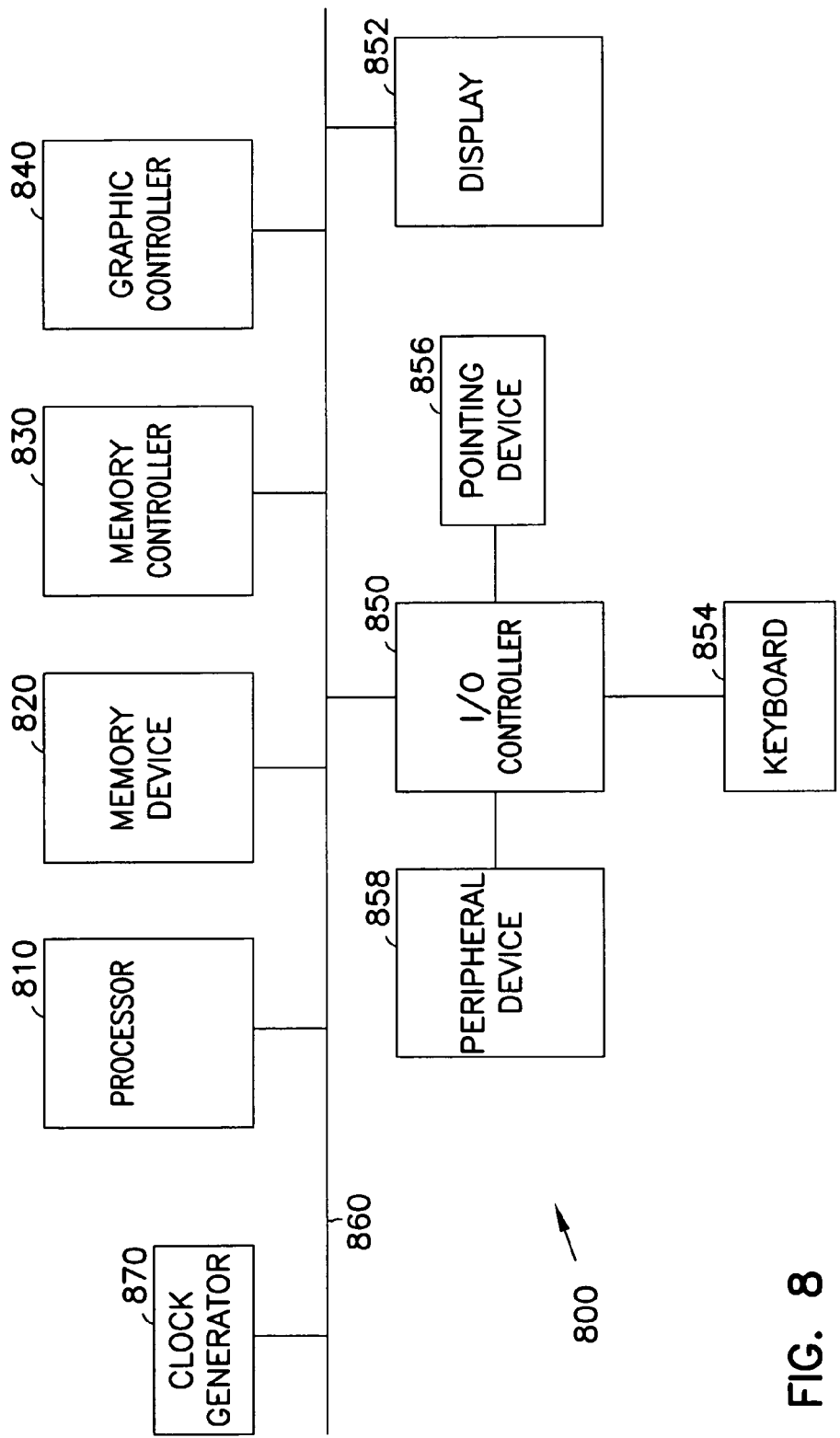
FIG. 8 shows a system according to an embodiment of the invention.

FIG. 8 shows a system 800. System 800 includes a processor 810, a memory device 820, a memory controller 830, a graphic controller 840, and an input and output (I/O) controller 850, a display 852, a keyboard 854, a pointing device 856, and a peripheral device 858. A data bus 860 connects all of these devices together. A clock generator 870 provides a clock signal to at least one of the devices of system 800 via data bus 860. An example of clock generator 870 includes an oscillator in a circuit board such as a motherboard. Two or more devices shown in system 800 may be formed in a single chip.

Memory device 820 includes memory device 100 (FIG. 1). Further, at least one of the devices shown in system 800 includes elements similar to the elements of memory device 100 of FIG. 1 for transferring conditioning data to data lines such as data lines 194 to improve the accuracy of data such as the memory data in memory array 102 of FIG. 1.

Data bus 860 may be interconnect traces on a circuit board or may be one or more cables. Data bus 860 may also couple the devices of system 800 by wireless means such as by electromagnetic radiations, for example, radio waves. Peripheral device 858 may be a printer, an optical device such as CD-ROM and DVD reader and writer, a magnetic device reader and writer such as a floppy disk driver, or an audio device such as a microphone.

System 800 represented by FIG. 8 includes computers (e.g., desktops, laptops, hand-helds, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

CONCLUSION

Various embodiments of the invention provide circuits and methods for improving the accuracy of the transfer of data in a memory device.

As integrated circuits such as memory devices transfer data at a higher speed, the accuracy of the data outputted at data lines of the memory devices may be decreased because the relationship between the data and the timing information of the data may be harder to control at the higher speed. Embodiments of the invention improve the accuracy of the data outputted at the data lines by outputting conditioning data to the data lines and associated circuits before the data is outputted. The conditioning data provides conditioning to the data lines and the associated circuits to improve the relationship between the data and the timing information of the data so that the data is more accurately outputted at the data lines.

Although specific embodiments are described herein, those skilled in the art recognize that other embodiments may be substituted for the specific embodiments shown to achieve the same purpose. This application covers any adaptations or variations of the present invention. Therefore, the present invention is limited only by the claims and all available equivalents.

What is claimed is:

1. A device comprising:
a plurality of data lines;
a memory array for storing memory data;
a conditioning data storage unit for storing conditioning data, wherein the conditioning data is different from the memory data transferred to and from the memory array;
a data selection circuit connected to the memory array and the conditioning data storage unit for selecting data between the memory data and the conditioning data;
a data transceiver circuit connected to the data selection circuit for outputting to the data lines the data selected by the data selection circuit; and
a strobe transceiver circuit for providing timing information of the data outputted at the data lines.

2. A device comprising:
a plurality of data lines;
a memory array for storing memory data;
a conditioning data storage unit for storing conditioning data;
a data selection circuit connected to the memory array and the conditioning data storage unit for selecting data between the memory data and the conditioning data;
a data transceiver circuit connected to the data selection circuit for outputting to the data lines the data selected by the data selection circuit;
a strobe transceiver circuit for providing timing information of the data outputted at the data lines; and
an output enable unit having a driver enable circuit connected to the strobe and data transceiver circuits for simultaneously enabling the strobe and data transceiver circuits at a first time during a memory operation.

3. The device of claim 2, wherein the output enable unit further includes a data enable circuit connected to the data selection circuit for enabling the data selection circuit to select the memory data at a second time during the memory access operation.

4. The device of claim 1, wherein the conditioning data storage unit includes multiple cells for storing multiple bits of data.

5. A device comprising:
a plurality of data lines;
a memory array for storing memory data;
a conditioning data storage unit for storing conditioning data, wherein the conditioning data storage unit includes only one cell for storing only one bit of data;
a data selection circuit connected to the memory array and the conditioning data storage unit for selecting data between the memory data and the conditioning data;
a data transceiver circuit connected to the data selection circuit for outputting to the data lines the data selected by the data selection circuit; and a strobe transceiver circuit for providing timing information of the data outputted at the data lines.

6. A device comprising:
a plurality of data lines;
a memory array for storing memory data;
a conditioning data storage unit for storing conditioning data, wherein the conditioning data storage unit is configured as a read-only storage unit;
a data selection circuit connected to the memory array and the conditioning data storage unit for selecting data between the memory data and the conditioning data;
a data transceiver circuit connected to the data selection circuit for outputting to the data lines the data selected by the data selection circuit; and
a strobe transceiver circuit for providing timing information of the data outputted at the data lines.

7. A device comprising:
a plurality of data lines;
a plurality of memory cells for storing memory data;
an output data path connected to the memory cells;
a conditioning data storage unit for storing conditioning data, wherein the conditioning data is different from the memory data transferred to and from the memory array;
a plurality of multiplexers, each of the multiplexers including a first input node connected to the output data path, a second input node connected to the conditioning data storage unit, and an multiplexing output node;
a plurality of data transceivers, each of the data transceivers connecting between the multiplexing output node and one of the data lines; and
a plurality of strobe transceivers for providing timing information of data outputted at the data lines.

8. A device comprising:
a plurality of data lines;
a plurality of memory cells for storing memory data;
an output data path connected to the memory cells;
a conditioning data storage unit for storing conditioning data, wherein the conditioning data storage unit includes a register connected to the second input node of the multiplexer;
a plurality of multiplexers, each of the multiplexers including a first input node connected to the output data path, a second input node connected to the conditioning data storage unit, and an multiplexing output node;
a plurality of data transceivers, each of the data transceivers connecting between the multiplexing output node and one of the data lines; and
a plurality of strobe transceivers for providing timing information of data outputted at the data lines.

9. The device of claim 8, wherein the register includes a single register cell.

10. The device of claim 9, wherein the single register cell is configured to store a conditioning bit having a bit value of zero.

11. The device of claim 8, wherein the register includes multiple register cells.

12. A device comprising:
a plurality of data lines;
a plurality of memory cells for storing memory data;
an output data path connected to the memory cells;
a conditioning data storage unit for storing conditioning data, wherein the conditioning data storage unit includes multiple register cells for storing multiple conditioning bits having multiple bit values;
a plurality of multiplexers, each of the multiplexers including a first input node connected to the output data path, a second input node connected to the conditioning data storage unit, and an multiplexing output node;
a plurality of data transceivers, each of the data transceivers connecting between the multiplexing output node and one of the data lines; and
a plurality of strobe transceivers for providing timing information of data outputted at the data lines.

13. The device of claim 12, wherein the conditioning data storage unit is configured such that the bit values of any two consecutive bits among the multiple conditioning bits are different from each other.

14. A device comprising:
a plurality of data lines;
a plurality of memory cells for storing memory data;
an output data path connected to the memory cells;
a storage node for storing conditioning data;
a plurality of multiplexers, each of the multiplexers including a first input node connected to the output data path, a second input node connected to the storage node, and an multiplexing output node;
a plurality of data transceivers, each of the data transceivers connecting between the multiplexing output node and one of the data lines; and
a plurality of strobe transceivers for providing timing information of data outputted at the data lines.

15. The device of claim 14, wherein the storage node connects to ground.

16. The device of claim 14, wherein the storage node connects to a voltage source.

17. The device of claim 14 further includes a driver enable circuit having an output node for providing a driver enable signal, wherein each of the data transceivers and each of the strobe transceivers connect to the same output node of the driver enable circuit.

18. The device of claim 17 further includes a data enable circuit having an output node for providing the data enable signal, wherein each of the multiplexers includes an enable node connected to the output node of the data enable circuit.

19. A system comprising:
a data bus;
a controller connected to the data bus; and
a memory device connected to the controller via the data bus, the memory device including:
a plurality of data lines connected to the data bus;
a memory array for storing memory data;
a conditioning data storage unit for storing conditioning data;
a data selection circuit connected to the memory array and the conditioning data storage unit for selecting data between the memory data and the conditioning data;
a data transceiver circuit connected to the data selection circuit for outputting to the data lines the data selected by the data selection circuit; and
a strobe transceiver circuit for providing timing information of the data outputted at the data lines.

20. The system of claim 19, wherein the data transceiver circuit includes a plurality of multiplexers, each of the multiplexers including a first input node connected to the memory array, a second input node connected to the conditioning data storage unit, and an multiplexing output node.

21. The system of claim 20, wherein the data transceiver circuit includes a plurality of data transceivers, each of the data transceivers connecting between the multiplexing output node and one of the data lines.

22. The system of claim 21, wherein the conditioning data storage unit includes multiple cells for storing multiple bits of data.

23. The system of claim 21, wherein the conditioning data storage unit includes only one cell for storing only one bit of data.

24. The system of claim 19, wherein the conditioning data storage unit is configured as a read-only storage unit.

25. The system of claim 19, wherein the conditioning data storage unit includes a number of register cells for storing multiple conditioning bits having multiple bit values.

26. The system of claim 25, wherein the conditioning data storage unit is configured such that the bit values of any two consecutive bits among the multiple conditioning bits are different from each other.

27. The system of claim 26, wherein the number of register cells is an odd number.

28. A method comprising:
setting a latency time interval for outputting memory data at a data line, wherein the latency time interval occurs between an issuance of a command signal and the availability of a first bit of the memory data at the data line;
outputting a conditioning data to the data line during the latency time interval; and
outputting the memory data to the data line after the latency time.

29. The method of claim 28, wherein the conditioning data includes a single conditioning bit.

30. The method of claim 29, wherein the single conditioning bit has a bit value of zero.

31. The method of claim 29, wherein the data line has an initial signal level representing a bit value before the conditioning data is transferred to the data line, wherein the single conditioning bit has a bit value, and wherein the bit value of the single conditioning bit is unequal to the bit value of the data line.

32. The method of claim 28, wherein the conditioning data includes multiple conditioning bits.

33. The method of claim 32, wherein any two consecutive bits among the number of conditioning bits have bit values different from each other.

34. The method of claim 32, wherein the number of conditioning bits is an odd number.

35. The method of claim 28, wherein outputting the conditioning data and outputting the memory data to the data line include performing a multiplexing function to select data between the conditioning data from a conditioning data storage unit and the memory data from a memory array.

36. The method of claim 28, wherein outputting the memory data includes outputting the memory data at the data line at a data rate of at least one gigabits per second.

37. A method comprising:
issuing a command signal to access memory data from a memory array;
outputting a strobe signal to a strobe line after the command signal is issued, the strobe signal having a plurality of signal transitions, wherein each of the signal transitions occurs when the strobe signal switches between a first signal level and a second signal level;
transferring a conditioning bit from a conditioning data storage unit to a data line at a first signal transition of the strobe signal after the command signal is issued; and
transferring the memory data from the memory array to the data line after the transferring of the conditioning bit.

38. The method of claim 37, wherein transferring the memory data occurs when the strobe signal has a second signal transition after the command signal is issued.

39. The method of claim 37, wherein before the conditioning bit is transferred, the data line has an initial signal level representing a bit value, and wherein the conditioning bit has a bit value unequal to the bit value of the data line.

40. The method of claim 37, wherein the conditioning bit has a bit value of zero.

41. A method comprising:
issuing a command signal;
providing a strobe signal to a strobe line after the command signal is issued, the strobe signal having a plurality of signal transitions, wherein each of the signal transition occurs when the strobe signal switches between a first signal level and second signal level;
transferring a conditioning data from a conditioning data storage unit to a data line during a conditioning time interval after the command signal is issued; and
transferring a memory data from a memory array to the data line after the conditioning time interval.

42. The method of claim 41, wherein transferring the conditioning data occurs when the strobe signal has a first signal transition after the command signal is issued.

43. The method of claim 42, wherein the conditioning data includes a single conditioning bit.

44. The method of claim 43, wherein the single conditioning bit has a bit value of zero.

45. The method of claim 41, wherein the strobe signal has at least one signal transition during the conditioning time interval.

46. The method of claim 45, wherein transferring the conditioning data includes transferring a number of conditioning bits.

47. The method of claim 46, wherein at least two of the conditioning bits have bit values different from each other.

48. The method of claim 46, wherein the number of conditioning bits equals a number of signal transitions of the strobe signal during the conditioning time interval.

49. The method of claim 46, wherein transferring the number of conditioning bits includes transferring one of the conditioning bits when the strobe signal has a first signal transition after the command signal is issued.

50. The method of claim 41, wherein the command signal is a read command signal for reading data from the memory array.

51. A method comprising:
issuing a command signal;
simultaneously enabling a strobe transceiver and a data transceiver during a conditioning time interval after the command signal is issued;
outputting a strobe signal from the strobe transceiver to a strobe line;
transferring a conditioning data from a conditioning data storage unit to the data transceiver based on a first state of a data enable signal;
outputting the conditioning data from the data transceiver to a data line during the conditioning time interval;
transferring a memory data from a memory array to the data transceiver based on a second state of the data enable signal; and
outputting the memory data from the data transceiver to the data line after the conditioning time interval.

52. The method of claim 51, wherein transferring the conditioning data and transferring the memory data to the data transceiver include performing a multiplexing function to select data between the conditioning data and the memory data.

53. The method of claim 51, wherein the conditioning data includes a single conditioning bit.

54. The method of claim 53, wherein the single conditioning has a bit value of zero.

55. The method of claim 51, wherein the conditioning data includes multiple conditioning bits.

56. The method of claim 55, wherein a first conditioning bit of the multiple conditioning bits has a first bit value and a second conditioning bit of the multiple conditioning bits has a second bit value.

* * * * *